United States Patent
Ku et al.

(10) Patent No.: US 6,299,692 B1
(45) Date of Patent: Oct. 9, 2001

(54) HEAD FOR VAPORIZING AND FLOWING VARIOUS PRECURSOR MATERIALS ONTO SEMICONDUCTOR WAFERS DURING CHEMICAL VAPOR DEPOSITION

(75) Inventors: Vincent Ku, San Jose; Ming Xi, Milpitas; Xiaoxiong Yuan, Cupertino; Anzhong Chang, San Jose; Anh N. Nguyen, Milpitas, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/621,335

(22) Filed: Jul. 21, 2000

(51) Int. Cl.[7] .................................................. C23C 16/00
(52) U.S. Cl. .......................... 118/726; 118/715; 392/397
(58) Field of Search .................... 118/715, 726; 392/397

(56) References Cited

U.S. PATENT DOCUMENTS 5,284,519 * 2/1994 Gadgil .................................. 118/715
6,036,783 * 3/2000 Fukunaga .............................. 118/715
6,179,920 * 1/2001 Tarutani ............................... 118/715
6,210,485 * 4/2001 Zhao .................................... 118/715

* cited by examiner

*Primary Examiner*—Richard Bueker
(74) *Attorney, Agent, or Firm*—Ostroff & Associates

(57) ABSTRACT

A vaporizer head for evenly flowing at low pressure into a processing chamber vaporized precursor compounds for deposition of metal and other layers onto a semiconductor, has a bulb-like body with a center axis, a lengthwise cavity, an input end and an output end. The cavity has an opening for receiving a stream of vaporized precursor compound. There are a plurality of passages for flow of vapor through the head, each passage having a length and a diameter. They extend radially from along and around the cavity like the spokes of a wheel at inclined angles relative to the center axis from the cavity to a tapered output surface of the head. The cavity has a well-like bottom for capturing any droplets or particles of precursor compound and preventing them from leaving the head except as vapor. The plurality of passages have sufficiently large diameters such that there is only a low pressure drop in the vapor flowing through the head.

15 Claims, 3 Drawing Sheets

HEAD FOR VAPORIZING AND FLOWING VARIOUS PRECURSOR MATERIALS ONTO SEMICONDUCTOR WAFERS DURING CHEMICAL VAPOR DEPOSITION

FIELD OF THE INVENTION

This invention relates to a head for vaporizing solid and/or liquid PRECURSOR compounds and for injecting them as vapor into a processing chamber during chemical vapor deposition onto surfaces of a semiconductor to deposit thin films of materials such as tantalum, tantalum nitride, titanium, etc.

BACKGROUND OF THE INVENTION

The growth in the use, and usefulness, of semiconductors has been accompanied by the development of new processes and materials for the design and manufacture of semiconductors together with new or improved manufacturing equipment and hardware. Important recent improvements in design and new materials have led to faster speeds of operation and greater densities for very large scale integrated (VLSI) circuits. The use of new materials such as tantalum, titanium, and other metals, has led to the need for more efficient ways of applying them to semiconductor surfaces.

A layer or film of a metal such as tantalum, titanium, etc. can be deposited by chemical vapor deposition (CVD) onto exposed surfaces of a semiconductor wafer during processing into VLSIs. For example, a precursor compound of the metal tantalum, namely pentadiethylaminotantalum (PDEAT), can be vaporized under certain conditions of pressure and temperature to obtain a gaseous or vapor phase of the compound which may then be used in CVD processing to form a layer of metal. Precursor compounds of various metals require low pressures (e.g., a Torr or less and elevated temperatures (e.g., roughly 100° C.) to change them into and hold them in vapor phase. This will be explained in greater detail hereinafter.

It is desirable that a layer of metal being deposited by CVD on a semiconductor wafer be uniform in thickness. To achieve this, a chemical vapor precursor compound of the metal flowing into a processing chamber where the semiconductor wafer is being processed should be controlled in flow direction and amplitude so that the vapor is evenly distributed and flows uniformly toward the wafer. In addition, because a CVD process step using a precursor compound of a metal such as tantalum, titanium, etc., is typically carried out in a chamber maintained under low pressure conditions (e.g., a Torr or less), the flow of gas vapor into the chamber through a vaporizer head should be impeded as little as possible by the head. The head should have high-flow-conductance so that pressure drop across it is low (e.g., a fraction of a Torr). The gas vapor should also be controlled in temperature as it passes through the head and enters the chamber to prevent condensation of the vapor into droplets or particles.

The present invention provides a simple and efficient vaporizer head with improved characteristics which fills these needs.

SUMMARY OF THE INVENTION

In accordance with the invention in one specific embodiment thereof, there is provided a vaporizer head for low pressure application of vapors of precursor compounds useful in chemical vapor deposition of materials such as titanium, tantalum, etc., onto the surfaces of semiconductors. The vaporizer head comprises a body having a center axis, an outer diameter, an outer surface, an input end, an output end, and a length between the ends. The body defines a cavity along the center axis from the input end to near but not through the output end for receiving a stream of vaporized precursor compound, the cavity having a closed well-like end for containing droplets or particles of condensed precursor compound which may occur. The body also defines a plurality of passages through the head for flow of vapor outward from the cavity through the outer surface, each passage having a length and a diameter and extending radially from the center axis at respective angles relative to the center axis. The plurality of passages have sufficiently large diameters to cause only low pressure drop to vapor flowing through them and to provide dispersion of vapor flowing through the head such that vapor flows evenly onto a semiconductor surface, the head providing a desired operating temperature for the vapor flowing through it.

In one specific embodiment the invention is a vaporizer head for applying vapors of precursor compounds useful in chemical vapor deposition of layers of materials onto semiconductors. The head comprises a body having a center axis, an outer diameter, an outer surface, an input end, an output end, and a length between the ends. The body defines a cavity along the center axis from the input end to near but not through the output end for receiving a stream of vaporized precursor compound. The cavity has a closed well-like bottom for containing droplets or particles of condensed precursor compound which may occur. The body defines a plurality of passages through the head for flow of vapor outward from the cavity through the outer surface. Each passage has a length and a diameter and extending radially from the center axis at respective angles relative to the center axis. The plurality of passages have sufficiently large diameters to cause only a pressure drop of less than about a Torr to vapor flowing through them and to provide dispersion of vapor flowing through the head such that vapor flows evenly onto a semiconductor surface. The head provides a desired operating temperature for the vapor flowing through it.

In an other specific embodiment the invention is a vaporizer head for flowing into a processing chamber vaporized precursor compounds during chemical vapor deposition of metal and other layers onto a semiconductor. The head comprises a body having a center axis, an inwardly tapered lower outer surface, an input end, an output end, and a length between the ends. The body defines a cavity along the center axis and having an opening in the input end for receiving a stream of vaporized precursor compound. The cavity has a closed well-like bottom near the output end for containing droplets and particles of the precursor compound and preventing them from leaving the head except as vapor. The body defines a first plurality of passages for flow of vapor, each passage having a length and a diameter and extending radially from the cavity like the spokes of a wheel at a first inclined angle relative to the center axis from the cavity to the lower outer surface. The body defines a second plurality of passages for flow of vapor, each passage having a length and a diameter and extending radially from the cavity like the spokes of a wheel at a second inclined angle relative to the center axis from the cavity to the lower outer surface. The body defines a third plurality of passages each having a length and a diameter and extending from just above the well-like bottom of the cavity to the output end of the body, the pluralities of passages having sufficiently large diameters to result during operation thereof of only a fraction of a Torr pressure drop to a flow of vapor flowing therethrough.

In still an other specific embodiment the invention is an apparatus for chemical vapor deposition onto semiconductor wafers. The apparatus comprises a processing chamber which can be maintained at sub-atmospheric pressure, a platform or susceptor within the chamber for holding a wafer during processing, and a vaporizer head for flowing into the chamber and onto a wafer vaporized precursor compounds for chemical vapor deposition of metal and other films onto the wafer. The head comprises a body having a center axis, an outer surface, input end, and output end, and a length between the ends. The body defines a cavity extending along the center axis with an opening in the input end for receiving a stream of vaporized material. The cavity has a closed well-like bottom end near the output end of the body for collecting droplets and particles of precursor compound and preventing them from leaving the head except as vapor. The body defines a plurality of passages through the head for flow of vaporized material. Each passage having a length and a diameter and extending radially like spokes of a wheel from along and around the cavity at an inclined angle relative to the center axis from the cavity to the outer surface, the plurality of passages having sufficiently large diameters to give pressure drop of a fraction of a Torr to the vaporized precursor compound flowing through them and to provide dispersion of flow through the head such that vaporized precursor compound flows evenly onto a wafer surface.

A better understanding of the invention together with a fuller appreciation of its many advantages will best be gained from a study of the following description given in conjunction with the accompanying drawings and claims.

The drawings are not necessarily to scale.

DETAILED DESCRIPTION

Figure 1:
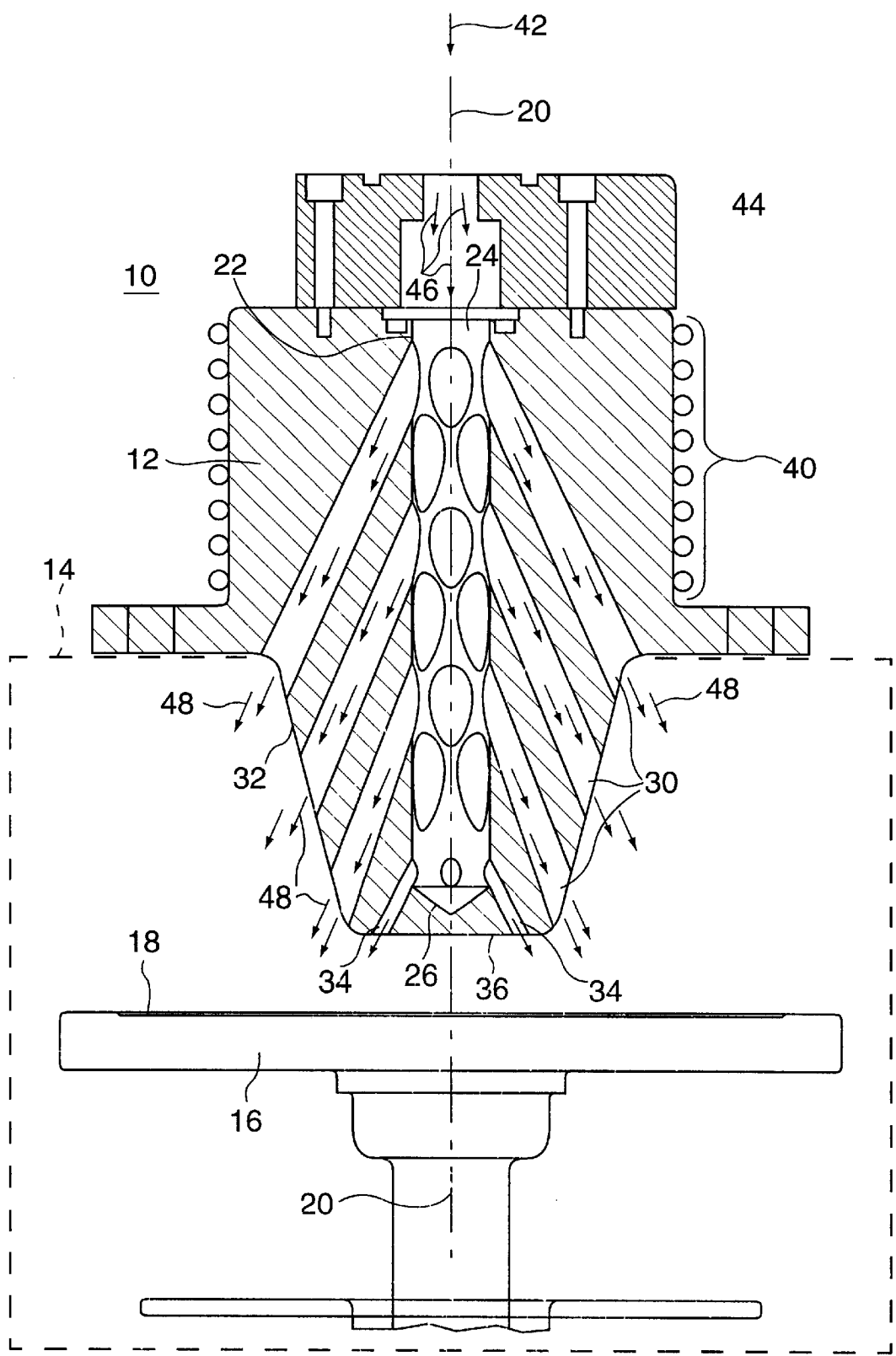
FIG. 1 is a cross-sectional view of a vaporizer head embodying features of the invention, together with portions (shown schematically) of an apparatus for chemical vapor deposition of materials onto semiconductor wafers.

Referring now to FIG. 1, there is shown an apparatus 10 useful for chemical vapor disposition (CVD) onto semiconductors of various materials in accordance with the present invention. The apparatus 10 comprises a vaporizer head 12 embodying features of the invention and shown in cross-section, a processing chamber 14 (indicated by a dashed-line rectangle), a susceptor (platform) 16, and a semiconductor wafer 18 positioned on the platform below the head 12. The chamber 14 is adapted to be maintained at sub-atmospheric pressure during CVD processing of the wafer 18. During such processing the wafer is heated to an elevated temperature (e.g., about 400° C.) by the platform 16. The chamber 14 and the platform 16 are well known and are not further described herein.

The vaporizer head 12 is hermetically sealed to the top of the chamber 14 by means not shown. The body of the vaporizer head 12 is generally cylindrical and has a center vertical axis 20 which is aligned with a center of the wafer 18. The head 12 defines a vertical cavity 22, concentric with the axis 20, which has a top opening 24 for entrance of vapor, and has a closed well-like bottom end 26. Radiating outward and angularly downward from the cavity 22 like the spokes of a wheel are a plurality of elongated passages 30. As will be explained hereinafter, the respective passages 30 are vertically spaced apart and are evenly spaced circumferentially around the center axis 20. Each passage 30 has a respective input end opening into the cavity 22 as will be further explained shortly, and an output end opening through a tapered side surface 32 of the head 12 and into the processing chamber 14. Near the bottom end 26 of the cavity 22 are a group of smaller passages 34 which also radiate outward and downward. Each of the passages 34 has an input end opening to the cavity 22 at a location somewhat above the bottom end 26 and an exit opening through a flat bottom surface 36 of the head 12 into the chamber 14.

During operation of the apparatus 10 the vaporizer head 12 is raised to a desired temperature (e.g., about 100° C.) by an electric heater 40, of a type which is commercially available. A source (not shown) supplies precursor material, as indicated by an arrow 42 to a module 44. The latter may if necessary apply ultrasonic and/or heat energy to the incoming precursor material to ensure that it is properly vaporized as the vapor enters the input opening 24 of the head 12, as indicated by the arrows 46. Such vaporized material then flows down the cavity 22, into respective ones of the passages 30 and 34, and into the processor chamber 14, as indicated by the various arrows 48. As will be explained in greater detail hereinafter, the vaporizer head 12 is configured so that the combined streams of vapor through the passages 30 and 34 flow evenly into the chamber 14 and uniformly down toward the surface of the wafer 18. The streams of vapor flowing through the passages 30 and 34 are kept at a desired temperature by heat transferred from the vaporizer head 12, which advantageously is formed from a solid block of aluminum having good heat conductivity. The cavity 22 and the respective passages 30 and 34 are easily machined into the body of the head 12.

The well-like end 26 at the bottom of the cavity 22 remaining acts to collect any droplets or particles which perchance may be present in the vapor stream 46 entering the input opening 24 of the cavity 22. Stray liquid or solid material collected in the well-like end 26 is quickly vaporized by heat from the head 12 and thus prevented from entering the chamber 14 except as vapor.

Figure 2:
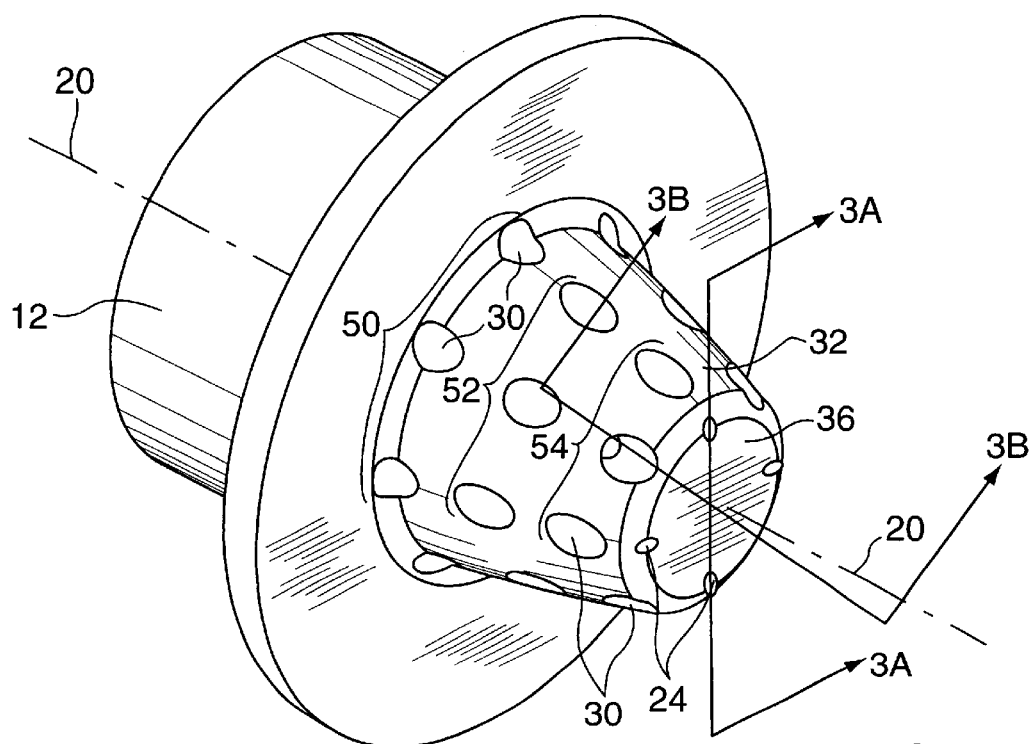
FIG. 2 is a perspective view of the vaporizer head showing the disposition of respective openings and various vapor passages through the head.

Referring now to FIG. 2, there is shown a perspective view of the vaporizer head 12. Output ends of the passages 30 are shown arranged in three vertically spaced-apart circular rows indicated by respective brackets 50, 52, and 54. The passages 30 in each of the rows 50, 52 and 54 are equally spaced angularly relative to the center axis 20. In the specific example of the vaporizer head 12 shown, the passages 30 are spaced equally by 45 degree angles around the center axis 20 of the body 12. Thus there are eight passages in each of the rows 50, 52, 54 for a total of twenty-four passages 30. The smaller passages 34 are spaced by 90 degree angles and there are four for a total of twenty-eight passages 30 and 34 together.

Figure 3A:
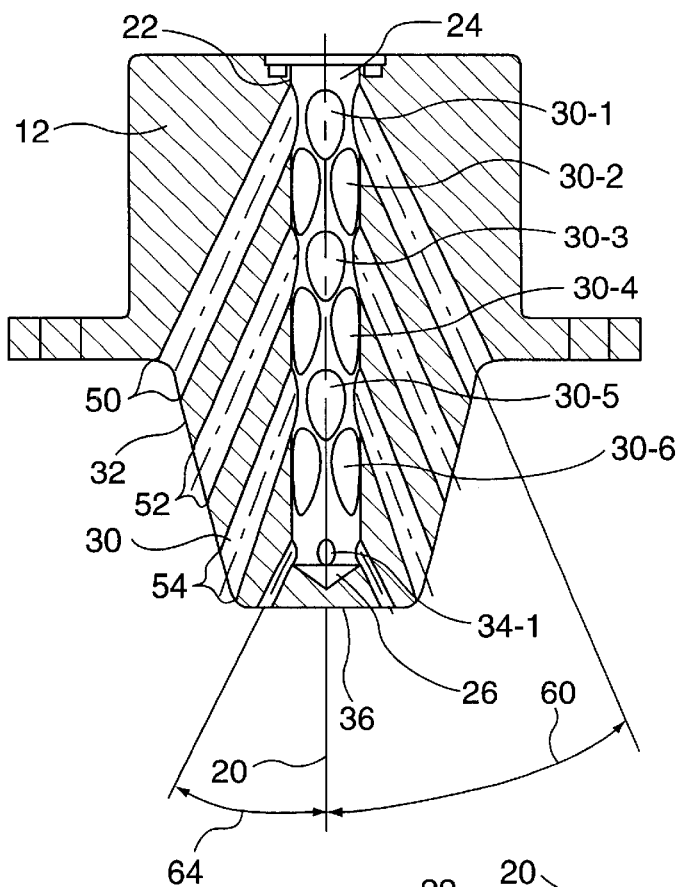
FIGS. 3A and 3B are sectional views of the vaporizer head taken as indicated in FIG. 2 by the lines 3A—3A and 3B—3B, showing certain dimensional and angular relations of vapor passages through the head.

Referring now to FIG. 3A, there is shown a side cross-sectioned view of the vaporizer head 12 taken through the dashed lines 3A—3A of FIG. 2. It should be noted that though shown smaller, this sectional view of the head 12 is closely similar to that shown in FIG. 1. As seen in FIG. 3A, there are visible in this view only two passages 30 in the top row 50 and these passages 30 have respective input ends 30-1 opening into the cavity 22 just below the top opening 24. These passages 30 (and the other passages 30 in this view) are formed in the body of the head 12 relative to the center axis 20 at an angle indicated by an arc 60. Two additional passages 30 in the top row 50, not visible in FIG. 3A since displaced by an angle of 90 degrees around the center axis 20 relative to those shown, also have respective input ends 30-1 opening into the cavity 22 adjacent its top opening 24. These unseen passages 30 also lie at the same downward angle 60.

As was mentioned previously in connection with FIG. 2, in the specific embodiment of the invention shown herein, the vaporizer head 12 has eight passages 30 with lower exit ends in the upper row 50 all of which exit ends lie along a single circle around the tapered surface 32 of the head 12. As was just explained, only four such passages 30 have input ends 30-1 opening 90 degrees apart into the cavity 22 near its top opening 24.

Figure 3B:
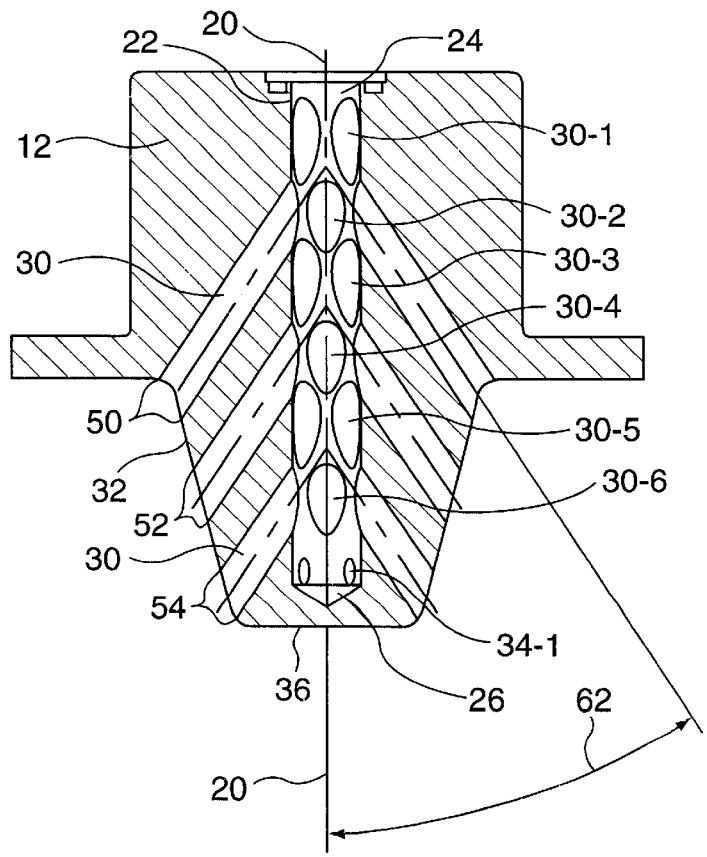

Referring now to FIG. 3B, there is shown a sectional view of the head 12 taken through a dashed line 3B—3B of FIG. 2. FIG. 3B is rotated by 45 degrees relative to FIG. 3A. As seen in FIG. 3B, the passages 30 (two being visible) in the top row 50 have input ends 30-2 opening into the cavity 22 below the ends 30-1 (FIG. 3A); and the passages 30 are formed in the body of the head 12 at an angle indicated by an arc 62. The latter angle is somewhat larger than the angle 60 so that the ends 30-2 lie below the ends 30-1. Two additional passages 30 are not visible in FIG. 3B since these lie at 90 degrees relative to the two passages 30 here visible in the top row 50, also have ends 30-2 opening into the cavity 22. By making the angle 60 in FIG. 3A slightly different from the angle 62 in FIG. 3B, the respective top ends 30-1, 30-2, 30-3, 30-4, 30-5 and 30-6 of the twenty-four passages 30 are interspersed at intervals down along the cavity 22 and around the axis 20. This provides for efficient dispersal of the vapor flowing into the cavity 22. The four smaller passages 34, only two of which are visible in FIG. 3A, are formed at an angle indicated by an arc 64 so that the respective top ends 34-1 of the passages 34 lie a small distance above the well-like bottom end 26 of the cavity 22.

Figure 4:
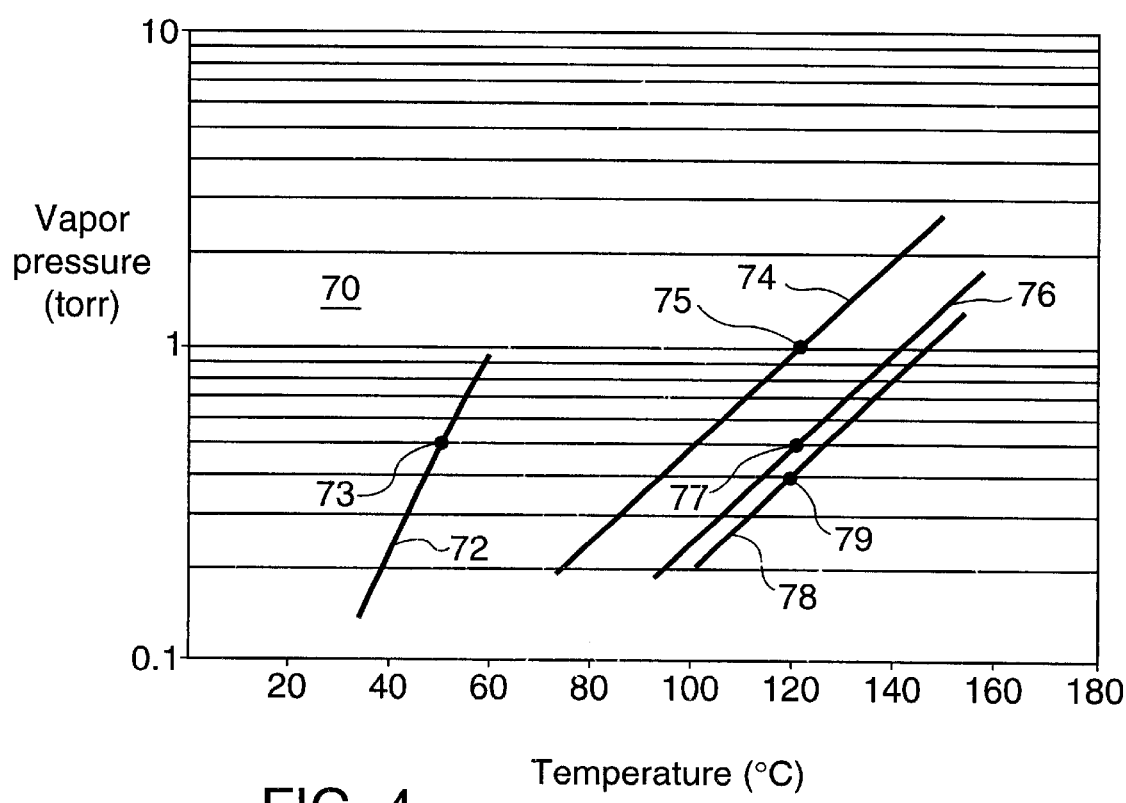
FIG. 4 is a graph illustrating the relationship of vapor phase versus solid (or liquid) phase of various CVD precursor compounds as a function of pressure and temperature.

Referring now to FIG. 4 there is shown a graph 70 illustrating the relationships of vapor phase to solid phase (or liquid) of CVD precursor compounds as a function of temperature versus pressure. The horizontal axis of the graph 70 indicates temperature in degrees Centigrade (° C.), and the vertical axis indicates pressure in Torr and is non-linear. The graph 70 has a first line 72 along which a precursor material such as tetradimethylaminotitanium (TDMAT) is in vapor phase. When the temperature or pressure moves sufficiently to the left or up in the graph 70 away from the line 72, the material returns to a solid (or liquid) state. For a given precursor material (e.g., TDMAT), when being used in CVD processing there are conveniently employed an operating value of temperature, and an operating value of pressure, such as indicated at a point 73 on the line 72. In the case of TDMAT, the temperature at point 73 may be about 50° C. and pressure about one-half TORR. The graph 70 has a second line 74 indicating vapor phase relationship of a second precursor material, namely pentaethylmethylaminotantalum (PEMAT) and a point 75 indicating operating values of temperature and pressure. Similarly, the graph 70 has a line 76 and an operating point 77 for pentadiethylaminotantalum (PDEAT), and a line 78 and an operating point 79 for pentadimethylaminotantalum (PDMAT).

It is apparent from the graph 70 that each of the various precursor compounds illustrated, when employed in CVD processing in the apparatus 10, requires a low chamber pressure. Such material at normal atmospheric temperature and pressure is a solid (or liquid) but it can be made to change phase into vapor at suitably low pressure and elevated temperature. It is delivered, as indicated by the arrows 46, to the vaporizer head 12 (see FIG. 1) It is desirable therefore in order to prevent the vapor from returning to solid (or liquid) phase in passing through the head 12 that such vapor not be significantly impeded in its flow. Thus, the head 12 should have high-flow-conductance, i.e., the pressure drop through it be small (e.g., a fraction of a Torr). The head 12 should also maintain the vapor at a desired operating temperature (e.g., the temperature at point 73 on the line 72 of the graph 70) as the vapor passes within and through the head 12. The head 12 is easily maintained at a desired temperature by the heater 40.

In the specific embodiment of the invention illustrated herein, the vaporizer head 12 is somewhat bulb-shaped. The diameter of the larger passages 30 through the head is about 0.20 inch and the diameter of the smaller passages 34 is about 0.10 inch. The lengths of the passages 30 and 34 are much longer than their respective diameters. Because the passages 30 and 34 through the head 12 are relatively large, plasma-excited gas can pass through the head 12. This makes it possible to place a source for plasma excitation above the entrance 24 in the head 12 and outside of the chamber 14. The diameter of cavity 22 is about one-half inch and it extends down along the axis 20 to near (but not through) the bottom 36 of the head 12. The diameter of the upper part of the head 12 is about three inches, and its lower part tapers to about 1.5 inch diameter at the bottom 36. The length of the head 12 from the top entrance 24 to the bottom 36 is about four inches. The angle 60 (FIG. 3A) is about 28°, the angle 64 slightly larger, and the angle 62 (FIG. 3B) about 35°. During CVD processing a flow of vaporized precursor material (e.g., TDMAT) in the range from about 2 to 10 standard cubic centimeters per minute (SCCM) mixed with about 100 to 200 SCCM of argon was passed through the head 12 (maintained at desired temperature) into the chamber 14 where the pressure was a Torr or less (see FIG. 4). The temperature of the wafer 18 was about 400° C. and it was positioned about one-half inch from the bottom 36 of the head 12. The processing cycle lasted several minutes.

The above description is intended in illustration and not in limitation of the invention. Various changes or modifications in the vaporizer head 12 embodying features of the invention may occur to those skilled in the art and can be made without departing from the spirit or scope of the invention as set forth herein and as defined by the accompanying claims. For example, the invention is not limited to use with only the precursor materials mentioned but is useful with other CVD precursor materials. Still further, it is not limited to a particular set of dimensions or diameter of a vaporizer head, or to the particular numbers, sizes and angles of the passages 30 and 34, as described above, or to a particular material or method of manufacture for a vaporizer head.

What is claimed is:

1. A vaporizer head for applying vapors of precursor compounds useful in chemical vapor deposition of layers of materials onto semiconductors, the head comprising:

a body having a center axis, an outer diameter, an outer surface, an input end, an output end, and a length between the ends;

the body defining a cavity along the center axis from the input end to near but not through the output end for receiving a stream of vaporized precursor compound, the cavity having a closed well-like bottom for containing droplets or particles of condensed precursor compound which may occur;

the body defining a plurality of passages through the head for flow of vapor outward from the cavity through the outer surface, each passage having a length and a diameter and extending radially from the center axis at respective angles relative to the center axis; and the plurality of passages having sufficiently large diameters to cause only a pressure drop of less than about a Torr to vapor flowing through them and to provide dispersion of vapor flowing through the head such that vapor flows evenly onto a semiconductor surface, the head providing a desired operating temperature for the vapor flowing through it.

2. The vaporizer head of claim 1 wherein there are a first plurality and a second plurality of passages, the first plurality of passages having respective lengths and diameters substantially greater than the lengths and diameters of the second plurality of passages and lying at respective angles relative to the center axis different from the inclined angles of the second plurality of passages.

3. The vaporizer head of claim 1 wherein a first group of the passages have their output ends disposed in at least one circular row positioned around the outer surface of a lower portion of the body, the input ends of such passages being respectively disposed along and around the axis of the cavity.

4. The vaporizer head of claim 3 wherein the lower portion of the body has a tapered surface sloping inward toward the output end, and there are three circular rows evenly spaced along and around the tapered surface, output ends of the passages lying along the respective rows.

5. The vaporizer head of claim 4 wherein the body of the head is somewhat bulb-shaped, and wherein some of the passages lie at an inclined angle relative to the center axis different from an inclined angle along which other passages lie, such that input ends of the passages opening into the cavity are respectively disposed in a desired pattern along and around the cavity and the flow of vapor into the cavity is efficiently distributed and flows evenly from the head toward a semiconductor being processed through chemical vapor disposition.

6. A vaporizer head for flowing into a processing chamber vaporized precursor compounds during chemical vapor deposition of metal and other layers onto a semiconductor, the head comprising:

a body having a center axis, an inwardly tapered lower outer surface, an input end, an output end, and a length between the ends;

the body defining a cavity along the center axis and having an opening in the input end for receiving a stream of vaporized precursor compound, the cavity having a closed well-like bottom near the output end for containing droplets and particles of the precursor compound and preventing them from leaving the head except as vapor;

the body defining a first plurality of passages for flow of vapor, each passage having a length and a diameter and extending radially from the cavity like the spokes of a wheel at a first inclined angle relative to the center axis from the cavity to the lower outer surface;

the body defining a second plurality of passages for flow of vapor, each passage having a length and a diameter and extending radially from the cavity like the spokes of a wheel at a second inclined angle relative to the center axis from the cavity to the lower outer surface; and the body defining a third plurality of passages each having a length and a diameter and extending from just above the well-like bottom of the cavity to the output end of the body, the pluralities of passages having sufficiently large diameters to result during operation thereof of only a fraction of a Torr pressure drop to a flow of vapor flowing therethrough.

7. The vaporizer head of claim 6 wherein the first and second plurality of passages have diameters of about 0.2 inch, the third plurality of passages have diameters of about 0.1 inch, the length of the body being about 4 inches, and the diameter of the cavity being about 0.5 inch.

8. The vaporizer head of claim 6 wherein the first and second plurality of passages have output ends respectively spaced along a plurality of spaced apart circular rows located around the tapered lower outer surface of the body, the input ends of the passages being located in a desired pattern along the length of the cavity and around the center axis.

9. The vaporizer head of claim 8 wherein there are twelve equally spaced passages in the first plurality and twelve equally spaced in the second plurality of passages each having a diameter of about 0.2 inch, the output ends of the passages being disposed respectively along three circular rows.

10. The vaporizer head of claim 8 wherein the input ends of the third plurality of passages are respectively located in the cavity above the well-like bottom and their output ends are disposed around the output end of the body.

11. The vaporizer head of claim 6 wherein the body is aluminum.

12. The vaporizer head of claim 6 further comprising a heater located around an upper part of the body to regulate the temperature of vapor flowing through the head during operation thereof.

13. Apparatus for chemical vapor deposition onto semiconductor wafers, the apparatus comprising:

a processing chamber which can be maintained at subatmospheric pressure;

a platform or susceptor within the chamber for holding a wafer during processing; and a vaporizer head for flowing into the chamber and onto a wafer vaporized precursor compounds for chemical vapor deposition of metal and other films onto the wafer, the head comprising:

a body having a center axis, an outer surface, input end, and output end, and a length between the ends;

the body defining a cavity extending along the center axis with an opening in the input end for receiving a stream of vaporized material, the cavity having a closed well-like bottom end near the output end of the body for collecting droplets and particles of precursor compound and preventing them from leaving the head except as vapor; and the body defining a plurality of passages through the head for flow of vaporized material, each passage having a length and a diameter and extending radially like spokes of a wheel from along and around the cavity at an inclined angle relative to the center axis from the cavity to the outer surface, the plurality of passages having sufficiently large diameters to give pressure drop of a fraction of a Torr to the vaporized precursor compound flowing through them and to provide dispersion of flow through the head such that vaporized precursor compound flows evenly onto a wafer surface.

14. The apparatus of claim 13 further comprising a heater coupled to the vaporizer head such that various precursor compounds can be maintained at desired vapor temperatures as they flow through the head.

15. The apparatus of claim 14 wherein the heater is coupled to an upper outside portion of the vaporizer head.

* * * * *